United States Patent [19]

Sekiya et al.

[11] Patent Number: 4,678,732

[45] Date of Patent: Jul. 7, 1987

[54] METHOD FOR MANUFACTURE OF PHOTO-SEMICONDUCTOR

[75] Inventors: Tadashi Sekiya, Nagoya; Akihiro Tsuzuki, Toyota; Yasuyoshi Torii, Nagoya, all of Japan

[73] Assignees: Agency of Industrial Science & Technology; Ministry of International Trade & Industry, both of Tokyo, Japan

[21] Appl. No.: 775,393

[22] Filed: Sep. 12, 1985

[30] Foreign Application Priority Data

Sep. 12, 1984 [JP] Japan .................................. 59-191115

[51] Int. Cl.⁴ .............................................. H01B 1/06
[52] U.S. Cl. .................................... 430/136; 252/518
[58] Field of Search ............... 430/322, 136; 428/434; 252/518; 264/332; 29/581; 164/480

[56] References Cited

U.S. PATENT DOCUMENTS

| | | | |
|---|---|---|---|
| 382,321 | 5/1888 | Norton et al. | 164/480 |
| 2,008,626 | 7/1935 | Murakami | 164/480 |
| 4,042,535 | 8/1977 | May | 252/518 |
| 4,137,078 | 1/1979 | Izu et al. | 430/322 |
| 4,165,351 | 8/1979 | May | 252/518 |

*Primary Examiner*—John L. Goodrow
*Attorney, Agent, or Firm*—Oblon, Fisher, Spivak, McClelland & Maier

[57] ABSTRACT

A photo-semiconductor is produced by melting $Bi_2O_3$ or its mixture with a small amount of an oxide or fluoride and then quenching the resultant melt in the form of a film.

2 Claims, 1 Drawing Figure

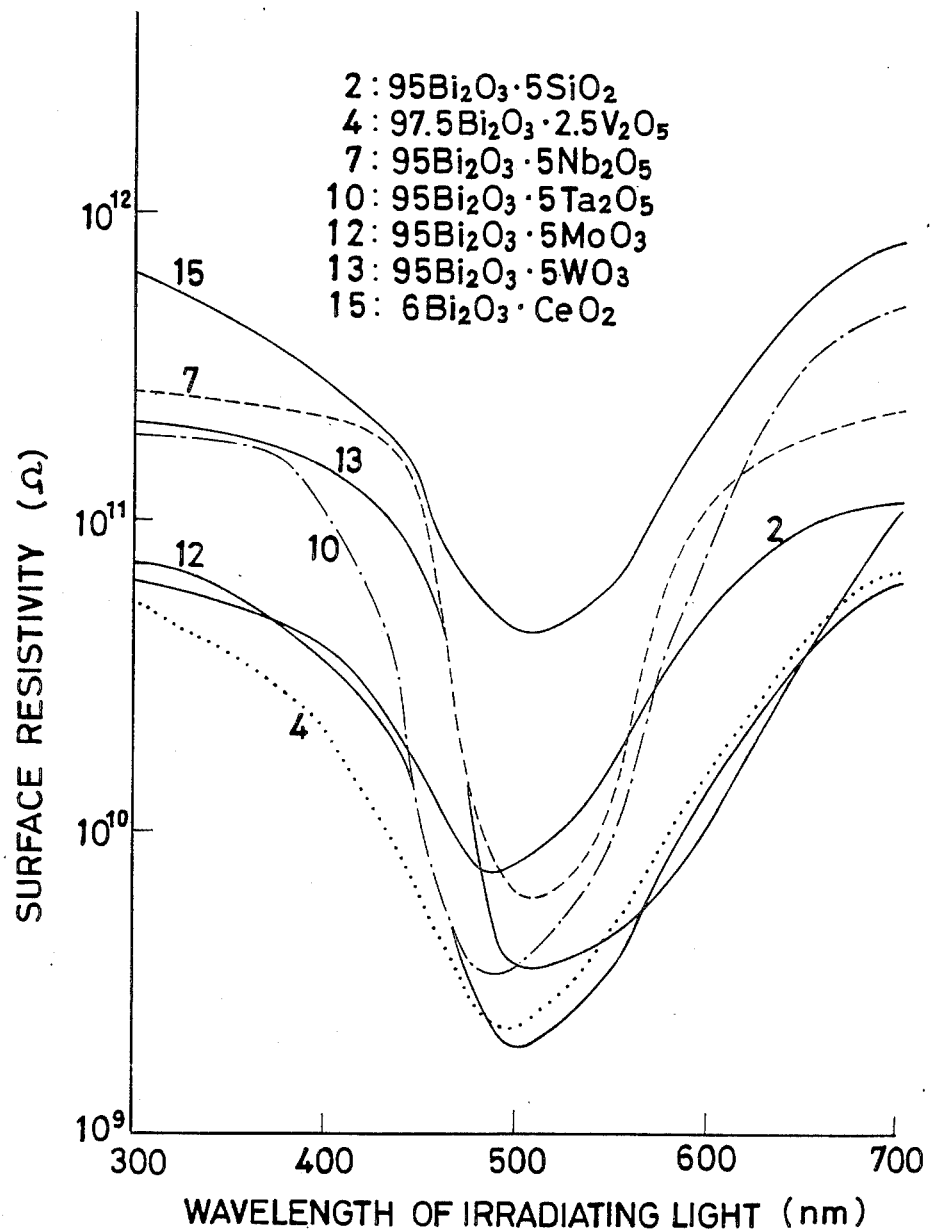

METHOD FOR MANUFACTURE OF PHOTO-SEMICONDUCTOR

FIELD OF THE INVENTION AND RELATED ART STATEMENT

This invention relates to bismuth oxide and its solid solution which exhibit the property of a remarkable decrease in the electric resistance when exposed to light (hereinafter referred to as "photoconductivity or photo-semiconductivity"). A substance showing such property is a photo-semiconductor. This invention, therefore, relates to a method for preparing bismuth oxide and its solid solution which are photo-semiconductors. The photo-semiconductors can be expected to be applied chiefly for photo-detecting materials and photo-switching materials in the field of optoelectronics.

Now, the photo-semiconductors will be described in more detail. Photo-semiconductivity refers to the phenomenon that a certain semiconductor or insulator gains in electronconductivity when exposed to light. Such photo-semiconductivity is widely utilized in television cameras, infrared detectors, photometers, etc. The photo-semiconductive substances which have been actually used at present are chalcogen compounds such as cadmium sulfide (CdS), lead sulfide (PbS), lead selnide (PbSe) and cadmium mercury tellulride (CdHgTe), and silicon (Si) and germanium (Ge) single crystals incorporating certain kinds and amounts of impurities. They are virtually wholly non-oxide type substances. They are generally used in the form of a film. Although they possess fairly high levels of photo-semiconductivity, they are thermally and chemically unstable. Further, they are required to possess an exactly defined composition and, therefore, necessitates a highly advanced technique for their production. The conditions under which they are effectively used have their own limits because they exhibit their photo-semiconductivity at low temperatures. Generally, oxides are stable as compared with the aforementioned substances. Thus, the desirability of developing an oxide which is excellent in photo-semiconductivity and is easy to manufacture has been finding growing recognition. At present, only a few $\gamma$-$Bi_2O_3$ solid solutions ($\gamma$-BSO and $\gamma$-BGO) of the compositions of $6Bi_2O_3.SiO_2$ (abbreviated as BSO) and $6Bi_2O_3.GeO_2$ (abbreviated as BGO) have been known to the art as oxides exhibiting photo-semiconductivity. In the cases of $\gamma$-BSO and $\gamma$-BGO single crystals, it has been demonstrated that they show an increase in their magnitudes of electroconductivity by roughly hundreds of times when irradiated with a visible ray (R. E. Aldrich et al: Journal of Applied Physics, Vol. 42, p 493 (1971) and S. L. Hou et al: Applied Physics Letters, Vol. 18, p 325 (1971)).

$Bi_2O_3$ exists in several polymorphous types such as $\alpha$, $\beta$, and $\delta$ types in addition to the $\gamma$ type. For example, $\delta$-$Bi_2O_3$ assumes a face-centered cubic fluorite type structure abounding with oxygen vacancy and is held to possess higher oxygen ion conductivity than stabilized zirconia ($ZrO_2$). Thus, the possibility of $\delta$-$Bi_2O_3$ being used as an oxygen sensor or a solid electrolyte at low temperatures is drawing growing attention.

The inventors have found after various related studies that materials excelling in photo-semiconductivity can be produced by a certain treatment of $\alpha$ type $Bi_2O_3$ or its mixture with small amounts of appropriate oxide or fluoride, which is described in detail afterward. The present invention has been perfected on the basis of this discovery.

OBJECT AND SUMMARY OF THE INVENTION

An object of this invention is to provide an easy method for the manufacture of a $\delta$-$Bi_2O_3$ photo-semiconductor.

Another object of this invention is to provide a method for the manufacture of a photo-semiconductor consisting of a solid solution of $Bi_2O_3$ with other oxide, which is easy to carry out.

To accomplish the objects described above, the method of this invention comprises melting $\alpha$-$Bi_2O_3$ alone or the mixture thereof with a small amount of a specific oxide or fluoride, dropping the resultant melt onto two rollers kept in rotation and thereby allowing the melt to be suddenly cooled in the form of a film. The film thus prepared exhibits excellent photo-semiconductivity.

BRIEF DESCRIPTION OF THE DRAWING

The drawing shows the relation between the surface resistivity of a film obtained by a method of this invention demonstrated in a working example and the wavelength of the irradiating light used.

DESCRIPTION OF THE PREFERRED EMBODIMENT $\delta$-$Bi_2O_3$ is stable at high temperatures as compared with $\alpha$-, $\beta$-, and $\gamma$-$Bi_2O_3$. This $\delta$-$Bi_2O_3$ is produced by firing a mixture of $\alpha$-$Bi_2O_3$ with a small amount of a specific second component. It cannot be produced by this method when $\alpha$-$Bi_2O_3$ alone is used or when the amount of the second component is not sufficient. The $\delta$-$Bi_2O_3$ or its solid solution can be obtained by first melting $Bi_2O_3$ and then suddenly cooling the resultant melt (T. Suzuki et al: Journal of Material Science, vol. 18, p 1845 (1983) and T. Sekiya et al: Material Research Bulletin, vol. 19, p 885 (1984)). On the other hand, the rapid quenching method based on rollers has recently been attracting attention in the meaning of producing an amorphous substance. Furthermore, this method is now drawing growing attention as means of freezing a high-temperature phase or producing a ceramic film with a high crystallographic orientation, neither of which has ever been attained by the conventional technique (T. Torii et al: Material Research Bulletin, vol. 16, p 1153 (1981), T. Suzuki et al: "Journal of Material Science, vol. 18, p 1845 (1983), and T. Sekiya et al: Material Research Bulletin, vol. 19, p 885 (1984)).

The present invention has been achieved as the result of a study applying the rapid quenching method using rollers to the melt of $Bi_2O_3$. For the purpose of this invention, a rapid quenching device operated on the principle called a twin-roller method (M. Tatsumisago et al: Journal of American Ceramic Society, vol. 64, p C-97 (1981)) can be utilized. When the melt of $Bi_2O_3$ or of a solid solution of $Bi_2O_3$ with a specific oxide or fluoride is rapidly quenched by the use of the aforementioned device, a $Bi_2O_3$ type solid solution which differs in structure from $\gamma$-BSO or $\gamma$-BGO and exhibits high photo-semiconductivity can be obtained.

By the rapid quenching treatment, the melt is spread in the form of a film and the $\gamma$ type phase is always precipitated in the film when $Bi_2O_3$ alone or its mixture with the second component is used as a melt. Occasionally, a few films are cooled to have a $\beta$ type phase precipitation, depending on the kind of the second component used. Most of the rapid-quenched films are crystallized as strongly oriented in the (111) plane. The magnitude of decrease in the electrical resistivity of the film in an optically activated state is equivalent to that of the single crystal of γ-BSO or γ-BGO. However, since the film shows a sharper spectrum in the relation between the wavelength of the irradiating light and the electrical resistance, it is logical to conclude that this film has high applicability as a light switching element. The method of this invention does not entail troublesome work, such as growth of a single crystal and slicing of a grown crystal, which has been inevitably involved in the conventional technique. The film obtained by this method can be converted into a finished device by simply attaching electrodes thereto. Thus, the method of this invention enjoys an advantage also in terms of production cost.

As described above, $Bi_2O_3$ can incorporate therein an oxide or fluoride as its second component. Concrete examples of the second component include $SiO_2$, $V_2O_5$, $Nb_2O_5$, $Ta_2O_5$, $MoO_3$, $WO_3$, $ZrO_2$, $CeO_2$, $TiO_2$, $ZnO$, $CdO$, $PbO$, $BiF_3$, $YF_3$ and $GdF_3$. Among the compounds enumerated above, $Ta_2O_5$, $MoO_5$, $WO_3$, $BiF_3$ and $YF_3$ are particularly desirable. The mixing ratio of $Bi_2O_3$ to the other oxide is variable with the kind of the added component. In any event, it is required to be such that $Bi_2O_3$ accounts for a proportion falling in the range of 5 to 10 mol% of the total amount of the resultant mixture. The product obtained from the mixture of $Bi_2O_3$ with the other oxide exhibits a different property corresponding to the kind and amount of the added oxide as compared with the product from $Bi_2O_3$ alone. The property may be, for example, an abrupt increase of the electroconductivity due to irradiation of a light containing a blue-greenish light (about 500 nm). The drops of the melt landing on the two rollers in rotation are suddenly cooled and solidified in the form of a film. The dimensions of the film thus obtained are variable with the kind of the added oxide and the size of the drops. Generally, they are 15 to 25 μm in thickness, 2 to 15 mm in width, and 2 to 15 mm in length. The $Bi_2O_3$ photo-semiconductor film produced by the method of this invention is a polycrystalline film. The properties exhibited in this film are comparable with those of a single-crystal countertype. This is because the crystal grains in the film are oriented in a certain direction. The grain-orientation occurs when the melt, during the course of passage through the gap between the two rollers, satisfies the conditions for unidirectional solidification. This method, therefore, deserves attention as a technique applicable to other electromagnetic and optical materials. Now, the present invention will be described more specifically below with reference to a working example.

EXAMPLE $Bi_2O_3$ photo-semiconductors were prepared by using such secondary additives as silicon dioxide ($SiO_2$), vanadium pentoxide ($V_2O_5$), niobium pentoxide ($Nb_2O_5$), tantalum pentoxide ($Ta_2O_5$), molybdenum oxide ($MoO_3$), tungsten oxide ($WO_3$), zirconium oxide ($ZrO_2$), cerium oxide ($CeO_2$), bismuth fluoride ($BiF_3$) and yttrium fluoride ($YF_3$). A raw material powder thoroughly mixed with the given components in a stated ratio was pressed into tablets. The tablets were fired in an electric furnace at 750° C. for five hours, finely ground, again pressed into rods 5 mm × 5 mm × 30 mm. The rods were fired at 750° C. for five hours and used as a sample for rapid quenching treatment. A rapid quenching device was composed of an infrared image furnace using a halogen lamp of 1.5 KW and two metallic rollers of 50 mm in diameter operated at a rate of 2,800 rotations per minute. The sample rods were melted in the furnace to become liquid beads. The molten beads were dropped between the two rollers in rotation to be spread and rapidly quenched. Consequently, there were obtained pieces of film about 20 μm in thickness, about 15 mm in width, and about 15 mm in length. The crystal phases precipitated in the rapidly quenched films with various compositions and the crystallographic orientations were examined by X-ray diffraction. The results are shown in Table 1.

TABLE 1

| | Results of rapid quenching treatment | | |
|---|---|---|---|
| Run No. | Starting composition (mol ratio) | Formed phase | Grain-orientation |
| 1 | $Bi_2O_3$ | δ | Slightly incomplete |
| 2 | $95Bi_2O_3.5SiO_2$ | δ | Complete |
| 3 | $90Bi_2O_3.10SiO_2$ | δ | Complete |
| 4 | $97.5Bi_2O_3.2.5V_2O_5$ | δ | Slightly incomplete |
| 5 | $95Bi_2O_3.5V_2O_5$ | δ | Slightly incomplete |
| 6 | $97.5Bi_2O_3.2.5Nb_2O_5$ | δ | Slightly incomplete |
| 7 | $95Bi_2O_3.5Nb_2O_5$ | δ | Complete |
| 8 | $90Bi_2O_3.10Nb_2O_5$ | δ | Complete |
| 9 | $97.5Bi_2O_3.2.5Ta_2O_5$ | δ | Slightly incomplete |
| 10 | $95Bi_2O_3.5Ta_2O_5$ | δ | Complete |
| 11 | $90Bi_2O_3.10Ta_2O_5$ | δ | Complete |
| 12 | $95Bi_2O_3.5MoO_3$ | δ | Complete |
| 13 | $95Bi_2O_3.5WO_3$ | δ | Complete |
| 14 | $95Bi_2O_3.5ZrO_2$ | β | Incomplete |
| 15 | $6Bi_2O_3.CeO_2$ | β | Incomplete |
| 16 | $Bi_2O_{2.9}.F_{0.2}$ | β | Incomplete |
| 17 | $95Bi_2O_3.5YF_3$ | β | Incomplete |

The crystal orientation was rated on the basis that a sample showing only peaks based on the (111) and its higher order (hhh) is "complete" and that a sample showing any other peak even to a slight extent is "slightly incomplete". Though samples containing $ZrO_2$, $CeO_2$ or $YF_3$ formed a tetragonal β phase and showed a high crystallographic orientation on the (111) plane, they are to be "incomplete" because their orienting property is inferior more or less.

The rapid-quenched film thus produced was coated with an electroconductive silver paste to form an electrode. This electrode was tested for electric resistance (surface inherent resistivity) under exposure to light. The irradiating light used for this purpose had a wavelength varying from 300 to 700 nm and the irradiation energy of the light was $5 \times 10^5$ to $19 \times 10^5$ erg/cm$^2$.sec. The results are shown in Table 2. The relation between the wavelength (nm) of the irradiating light and the surface inherent resistivity (Ω) is shown in the drawing. In the diagram, the results of Runs No. 2, 4, 7, 10, 12, 13, and 15 are shown.

TABLE 2

| | Results of irradiation | | |
|---|---|---|---|
| Run No. | Photo sensitivity | Wavelength of light at lowest electric resistance | Minimum number of digits of electric resistance |
| 1 | yes | 520 nm | 0.5 |
| 2 | yes | 490 | 1 |
| 3 | no | — | — |
| 4 | yes | 490 | 1.5 |
| 5 | no | — | — |
| 6 | yes | 485 | 1 |
| 7 | yes | 510 | 1.6 |
| 8 | no | — | — |
| 9 | yes | 500 | 1 |

TABLE 2-continued

| Run No. | Photo sensitivity | Results of irradiation Wavelength of light at lowest electric resistance | Minimum number of digits of electric resistance |
| --- | --- | --- | --- |
| 10 | yes | 490 | 2.2 |
| 11 | no | — | — |
| 12 | yes | 500 | 1.6 |
| 13 | yes | 510 | 2.0 |
| 14 | yes | 510 | 0.7 |
| 15 | yes | 510 | 1.3 |
| 16 | yes | 515 | 2.5 |
| 17 | yes | 490 | 2.3 |

From the foregoing results obtained in the example, it is noted that $\delta$-$Bi_2O_3$ type solid solutions exhibit photo-semiconductivity. The value of photo-semiconductivity reached their peaks generally in the neighborhood of 500 nm in wavelength. This tendency has a bearing on the color of the rapid-quenched film. Virtually all the rapid-quenched films assumed orange to dark orange colors. This fact indicates that they have absorption of greenish light (about 500 nm in wavelength). It is, therefore, logical to conclude that their photo-semiconductivity is caused by the lattice vibration excited by the absorption of this light. Regarding the relation between the photo-semiconductivity and the composition of film, the photo-semiconductivity is weak when the amount of the second additives is insufficient and is totally absent when the amount of the added second additive is excessive. The optimum composition of the solid solution varied from one kind to another of the second additive used. In the present example, the film composition was fixed very roughly. There are indications that manufacture of a photo-semiconductor with a still better quality will be materialized by appropriate selection of composition. In fact, $95Bi_2O_3.5Ta_2O_5$ (Run No. 10) and $95Bi_2O_3.5WO_3$ (Run No. 13) were obtained in the example which showed decreases of electric resistance by at least a few hundred times. These photo-semiconductors possessed properties sufficient to meet applications as light switching elements.

What is claimed is:

1. A rapid quenching method using roller for the manufacture of a photo-semiconductor capable of decreasing the electric resistance thereof by exposure to a light and exhibiting the smallest magnitude of eletric resistance to the light of a wavelength in the neighborhood of 500 nm, which method comprises molding, firing, and thermally fusing one powdered member selected from the group consisting of $95Bi_2O_3.5SiO_2$, $97.5Bi_2O_3.2.5V_2O$, $95-97.5BiO_2.2.5-5Nb_2O_5$, $95-97.5-BiO_2.2.5-5Ta_2O_5$, $95Bi_2O_3.5MoO_3$, $95Bi_2O_3.5WO_3$, $95Bi_2O_3.5ZrO_2$, $6Bi_2O_3.CeO_2$, $Bi_2O_{2.9}.F_{0.2}$ and $95Bi_2O_3.5YF_3$, and causing the resultant metal to drop in the form of beads between two rollers kept in rotation at a high speed thereby rolling and rapidly quenching said beads and obtaining thin oriented and crystallized pieces containing sigma- or beta-type phase crystals.

2. A method according to claim 1 wherein the powdered member is $95Bi_2O_3.5Ta_2O_5$ or $95Bi_2O_3.5WO_3$.

* * * * *